(12) United States Patent
Li

(10) Patent No.: US 10,395,087 B2
(45) Date of Patent: Aug. 27, 2019

(54) BIOMETRIC SENSING CHIP AND ELECTRONIC DEVICE USING SAME

(71) Applicant: SHENZHEN XINWEI TECHNOLOGY CO, LTD., Shenzhen, Guangdong (CN)

(72) Inventor: Wenjie Li, Guangdong (CN)

(73) Assignee: SHENZHEN XINWEI TECHNOLOGY CO, LTD., Shenzhen (CN)

( * ) Notice: Subject to any disclaimer, the term of this patent is extended or adjusted under 35 U.S.C. 154(b) by 0 days.

(21) Appl. No.: 15/871,193

(22) Filed: Jan. 15, 2018

(65) Prior Publication Data

US 2018/0150676 A1 May 31, 2018

Related U.S. Application Data

(63) Continuation of application No. PCT/CN2016/083979, filed on May 30, 2016.

(51) Int. Cl.
*G06K 9/00* (2006.01)
*H01L 23/31* (2006.01)
*H01L 23/495* (2006.01)
*H01L 23/60* (2006.01)

(52) U.S. Cl.
CPC ..... *G06K 9/00053* (2013.01); *G06K 9/00892* (2013.01); *H01L 23/3107* (2013.01); *H01L 23/495* (2013.01); *H01L 23/60* (2013.01); *H01L 2224/48484* (2013.01)

(58) Field of Classification Search
CPC ............ G06K 9/00053; G06K 9/00892; H01L 23/3107; H01L 23/60; H01L 23/495
See application file for complete search history.

(56) References Cited

U.S. PATENT DOCUMENTS

| 6,550,339 B1* | 4/2003 | Toyoda | G01L 15/00 73/716 |
|---|---|---|---|
| 9,025,301 B1* | 5/2015 | Adlam | G06K 9/0002 361/152 |
| 2014/0332983 A1* | 11/2014 | Ho | H01L 24/49 257/777 |
| 2016/0210496 A1* | 7/2016 | Lin | G06K 9/00053 |

FOREIGN PATENT DOCUMENTS

| CN | 103942530 A | 7/2014 |
|---|---|---|
| CN | 104051366 A | 9/2014 |
| CN | 204029787 U | 12/2014 |
| CN | 104700067 A | 6/2015 |
| CN | 205028275 U | 2/2016 |
| CN | 105428339 A | 3/2016 |
| TW | 200945539 A | 11/2009 |
| TW | 201246410 A1 | 11/2012 |

OTHER PUBLICATIONS

International Search Report of PCT Patent Application No. PCT/CN2016/083979 dated Feb. 13, 2017.
International Search Report of PCT Patent Application No. PCT/CN2016/083980 dated Mar. 1, 2017.

* cited by examiner

*Primary Examiner* — David Vu

(57) ABSTRACT

A biometric sensing chip includes a biometric sensing die including a memory circuit for saving data and an electrostatic conductor set above the memory circuit for discharging static electricity. An electronic device includes the biometric sensing chip described above is also provided.

18 Claims, 7 Drawing Sheets

BIOMETRIC SENSING CHIP AND ELECTRONIC DEVICE USING SAME

CROSS-REFERENCE TO RELATED APPLICATIONS

This application is a continuation under 35 U.S.C. § 120 of international patent application No. PCT/CN2016/083979, filed on May 30, 2016, the content of each application is hereby incorporated by reference.

FIELD

The subject matter herein generally relates to biometric identification technologies, and particularly, to a biometric sensing chip and an electronic device using same.

BACKGROUND

A biometric sensor gradually becomes a must-have element of an electronic device, especially for a mobile terminal. The biometric sensor, such as a fingerprint sensor, is needed to be contacted with or approached to by the user when senses the biological information in order to acquire a sensing signal strong enough.

However, a memory circuit of the biometric sensor for saving data may be damaged by the static electricity on human body when the user contacts with or approach to the biosensor, which leads to a failure or a low performance of the biometric sensor.

SUMMARY

To solve the technical problem set forth above, the present disclosure provides a biometric sensing chip and an electronic device using same which can prevent a memory circuit from a damage made by static electricity.

A biometric sensing chip includes a biometric sensing die including a memory circuit for saving data and an electrostatic conductor set above the memory circuit for discharging static electricity.

In some embodiments, the electrostatic conductor is partially or entirely set right above the memory circuit.

In some embodiments, the electrostatic conductor crosses over the memory circuit.

In some embodiments, the memory circuit is an ultraviolet erasable memory circuit.

In some embodiments, the memory circuit includes a one-time programmable memory and/or a multi-time programmable memory.

In some embodiments, the electrostatic conductor is directly or indirectly grounded for discharging the static electricity.

In some embodiments, the electrostatic conductor is a wire.

In some embodiments, the electrostatic conductor is formed as a protrusion or a tip right above the memory circuit.

In some embodiments, ways of setting the wire include that both ends of the wire are set on the biometric sensing die, one end of the wire is set on the biometric sensing die and the other end of the wire is set at a side of biometric sensing die, or both ends of the wire are correspondingly set at two opposite sides of the biometric sensing die.

In some embodiments, the biometric sensing chip further includes an encapsulant for encapsulating the biometric sensing die and the electrostatic conductor. The electrostatic conductor is located between the biometric sensing die and the encapsulant.

In some embodiments, the encapsulant is filled in a space between the electrostatic conductor and the encapsulant.

In some embodiments, the biometric sensing chip further includes two pads grounded directly or indirectly. The electrostatic conductor connects the two pads.

In some embodiments, ways of setting the pads include that both pads are set on the die, one of the two pads is set on the biometric sensing die and the other one of the two pads is set at one side of the biometric sensing die, or both pads are correspondingly set at two opposite sides of the biometric sensing die.

In some embodiments, the biometric sensing die defines a through hole corresponding to each pad when both pads are set on the biometric sensing die, and the electrostatic conductor is connected to the pad via the through hole.

In some embodiments, the biometric sensing chip defines a side surface for sensing biological information of a user. The electrostatic conductor is closer to the sensing surface than the memory circuit.

In some embodiments, the biometric sensing die further includes a sensing unit for sensing biological information of a user.

In some embodiments, the biometric sensing chip includes one or more than one of a fingerprint sensor chip, a blood oxygen sensor chip, and a heartbeat sensor chip.

The biometric sensing chip includes the electrostatic conductor set above the memory circuit. The electrostatic conductor can conduct the static electricity to ground when the user contacts with or approaches to the biometric sensing chip, thus the memory circuit is prevented from the damage made by the static electricity. Furthermore, the electrostatic conductor has the advantages of simple structure, less material consumption, and low material cost.

A biometric sensing chip includes a biometric sensing die including an ultraviolet erasable memory and a wire partially or entirely set right above the ultraviolet erasable memory. The wire is formed as a protrusion or a tip right above the biometric sensing die and is grounded directly or indirectly.

In some embodiments, the ultraviolet erasable memory includes a one-time programmable memory and/or a multi-time programmable memory.

In some embodiments, the biometric sensing chip comprises an encapsulant for encapsulating the biometric sensing die and the electrostatic conductor. The electrostatic conductor is located between the biometric sensing die and the encapsulant.

In some embodiments, the biometric sensing chip defines a side surface for sensing biological information of a user. The electrostatic conductor is closer to the sensing surface than the ultraviolet erasable memory.

The biometric sensing chip includes the electrostatic conductor set above the memory circuit. The electrostatic conductor can conduct the static electricity to ground when the user contacts with or approaches to the biometric sensing chip, thus the memory circuit is prevented from the damage made by the static electricity. Furthermore, the electrostatic conductor has the advantages of simple structure, less material consumption, and low material cost.

An electronic device includes the biometric sensing chip of any one of embodiments described above.

The electronic device includes the biometric sensing chip mentioned above, thus the electronic device also can prevent the memory circuit from the damage made by the static electricity and has the advantages of simple structure, less material consumption, and low material cost.

The above-described contents are detailed with specific and preferred embodiments for the present disclosure. The implementation of the present disclosure is not to be limited to these illustrations. For one of ordinary skill in the art, variations and equivalents having the same effects and applications can be made without departing from the spirit of the present disclosure and are to be considered as belonging to the scope of the present disclosure.

BRIEF DESCRIPTION OF THE DRAWINGS

The present disclosure is illustrated by way of embodiments and accompanying drawings.

DETAILED DESCRIPTION

Figure 1:
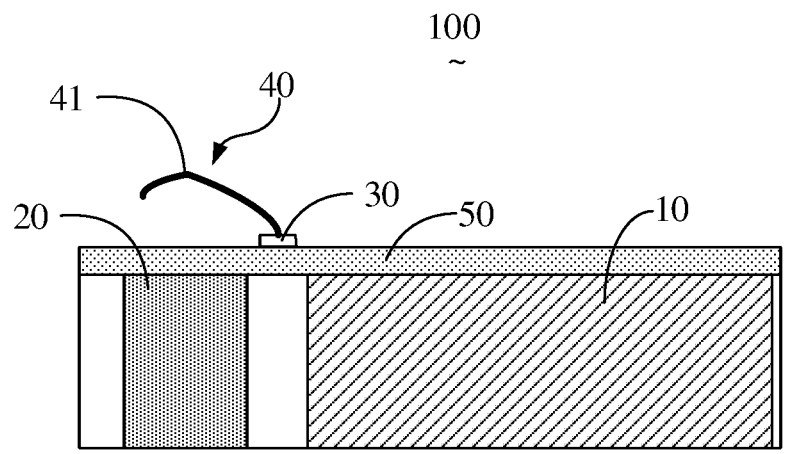
FIG. 1 is a cross sectional view of a first embodiment of a biometric sensing module of the present disclosure.

The embodiments are illustrated in more detail with reference to the drawings now. However, the disclosure can be implemented in many different embodiments, and cannot be limited to the embodiments described in the present disclosure. On the contrary, the embodiments described herein can make the disclosure fully and completely understood by those skilled in the art. The thickness and size of each layer and the number of elements in the drawings may be exaggerated, omitted, or schematically shown for the convenience and clarity of description. That is, the size of elements in the drawing are not required to be the full size thereof, and the number of elements are also not required to be the actual number thereof. The same reference numbers in the drawings denote the same or similar structures. A part indicated by the dashed line in the drawings represents the inside part of a solid and is shown for the convenience of description in the present disclosure. In fact, the dashed line parts can not be seen from the outside.

In description of the present disclosure, it is understood that the term "a number of" or "a plurality of" is defined as two or more than two, unless there is the other definite limitation. Correspondingly, this definition can be applied to the other plural terms, such as "multiple", "different kinds of", and "many" The term "connect" can be understood as various connection, such as electrical connection, mechanical connection, coupling, direct connection, or indirect connection, and is not particularly limited unless there is a specified statement below. In addition, the ordinal terms, such as "first" and "second", appearing in the name of the elements do not limit the sequential order of the appearance of the elements, and is just for the convenience of naming and distinguishing the elements, so as to make the description more clear and concise.

In the present disclosure, the terms "thickness", "above", "below", "front", "back", "left", "right", "perpendicular", "horizontal", "top", "bottom", "inner", "outer", etc. are based on the orientation or positional relation schematically shown in the drawings, which is just for the convenience of simplified description rather than indicating or implying the apparatus or element must has a specific orientation or to be constructed and operated in a specific orientation, and thus cannot be understood as a limitation to the disclosure.

Furthermore, the features and structures described herein may be combined into one or more than one embodiments in any appropriate way. A lot of details are provided in the following description to give a thorough understanding of the embodiments of the present disclosure. However, one of ordinary skill in the art should realize that the embodiments of the present disclosure still can be implemented without one or more than one of said details or by employing the other structures or components. In the other instances, the well-known details or operations are not provided in order to avoid obscuring the present disclosure.

A biometric sensing module is provided in the present disclosure. The biometric sensing module is used to sense the biological information input by an object. Preferably, the biometric sensing module is completely formed in a biometric sensing chip. In detail, the biometric sensing chip includes a biometric sensing die and an electrostatic conductor. The biometric sensing die includes a memory circuit. The memory circuit is used to save data. The data, for example, can be initialization data of a circuit of the biometric sensing chip, product model, etc. The electrostatic conductor is partially or entirely formed above the biometric sensing die. Preferably, the electrostatic conductor is formed as a protrusion or a tip right above the memory circuit and directly or indirectly grounded to discharge the static electricity.

Furthermore, the biometric sensing chip further includes an encapsulant. The encapsulant is used to encapsulate the biometric sensing die and the electrostatic conductor. The electrostatic conductor is formed between the biometric sensing die and the encapsulant. The encapsulant is filled in a space between the electrostatic conductor and the encapsulant.

One side surface of the encapsulant is defined as a sensing surface of the biometric sensing chip for sensing an input operation of the user. The electrostatic conductor is closer to the sensing surface than the memory circuit. The electrostatic conductor conducts the static electricity of the user to ground when the user approaches to or contacts with the sensing surface, thus a loss or a damage of the memory circuit made by the static electricity can be avoid.

The electrostatic conductor can be, for example, a wire. The protrusion or the tip can be formed by a wire bonding process. However, the electrostatic conductor is not limited to the wire, and can be other different shaped conductive members.

The memory circuit can be, for example, an ultraviolet erasable memory. The ultraviolet erasable memory, for example, can be a one-time programmable memory (OTP memory) and/or a multi-time programmable memory (MTP memory). However, the memory circuit can be other different kinds of memory and is not limited to the ultraviolet erasable memory described herein.

In the present disclosure, a fingerprint sensor chip is taken as an example of the biometric sensing chip. The memory circuit is usually set in a fingerprint sensing die of the fingerprint sensor chip. The electrostatic conductor is set above the corresponding memory circuit in the fingerprint sensor chip for absorbing the static electricity flowing towards the memory circuit. For example, the electrostatic conductor can be a metal conductive element, but is not limited thereto.

In particular, the OTP memory is taken as an example for illustration when the memory circuit is the ultraviolet erasable memory. After the fingerprint sensing die is taped out, and before the fingerprint sensing die is encapsulated to be the fingerprint sensor chip, the fingerprint sensing die needs to be tested by writing the data to the OTP memory. The data written in the OTP memory during the test is erased by the ultraviolet when the OTP memory passes the test. The electrostatic conductor cannot be set above the OTP memory of the fingerprint sensing die because the OTP memory needs to be erased by the ultraviolet during the test of the fingerprint sensing die.

If the fingerprint sensing die (it is noted that there is no electrostatic conductor set on said fingerprint sensor chip) is encapsulated to be the fingerprint sensor chip, the OTP memory is more likely to be damaged by the static electricity of human body due to the absence of the conductive metal element when the user approaches to or contacts with the fingerprint sensor chip, thus the fingerprint sensor chip breaks down.

To solve the problem set forth above, the electrostatic conductor is formed above the fingerprint sensing die when the fingerprint sensing die has passed the test and is going to be encapsulated to be the fingerprint sensor chip. Preferably, the electrostatic conductor is located right above the OTP memory or across the OTP memory. After that, the electrostatic conductor and the fingerprint sensing die are encapsulated into the encapsulant to form the fingerprint sensor chip. Thus, the electrostatic conductor conducts the static electricity flowing towards the OTP memory to the ground when the user approaches to or contacts with the fingerprint sensor chip having the electrostatic conductor, and the OTP memory can be prevented from the damage made by the static electricity.

In one embodiment, both ends of the wire are formed on the fingerprint sensing die.

In another embodiment, one of the both ends of the wire is formed on the fingerprint sensing die, and the other one of the both ends of the wire is formed at one side of the fingerprint sensing die.

In another embodiment, two ends of the wire are respectively formed at two sides of the fingerprint sensing die. Preferably, two ends of the wires are respectively formed at two opposite sides of the fingerprint sensing die. That is, the wire crosses over the fingerprint sensing die.

It is noted that one end or both ends of the wire are not formed on the fingerprint sensing die when one end or both ends of the wire are formed on one side or both sides of the fingerprint sensing die. For example, the fingerprint sensor chip further includes a circuit board when the fingerprint sensor chip employs the ball grid array package (BGA), the fingerprint sensing die and the electrostatic conductor are formed between the circuit board and the encapsulant, and one end or both ends of the wire can be formed on the circuit board.

Since the fingerprint sensor chip can be encapsulated in various ways, for example, a quad flat no-lead (QFN) encapsulation, correspondingly, the fingerprint sensor chip may not include the circuit board, but instead of a lead frame formed around the fingerprint sensing die.

The biometric sensing module includes one or more than one of a fingerprint sensing module, a blood oxygen sensing module, a heartbeat sensing module, a pressure sensing module, a humidity sensing module, a temperature sensing module, and an iris sensing module. Correspondingly, the biological information includes one or more than one of fingerprint information, blood oxygen information, heartbeat information, pressure information, humidity information, temperature information, and iris information.

The object to be sensed may be a finger of the user or the other part of the user's body, such as the eye, the heartbeat, the palm, the toe, the ears, etc., or a combination of any part of the user's body, even can be other suitable type of organisms not limited to the human body.

The present disclosure is further illustrated as below by way of embodiments and accompanying drawings.

Referring to FIG. 1, FIG. 1 illustrates a cross sectional view of the biometric sensing module 100 in accordance with a first embodiment of the present disclosure. The biometric sensing module 100 includes a sensing unit 10, a memory circuit 20, at least one pad 30, and an electrostatic conductor 40.

The sensing unit 10 is used to sense the biological information of the object when the object approaches to or contacts with the sensing unit 10. The memory circuit 20 is used to save the data. The data, for example, can be initialization data of a circuit in the biometric sensing module 100, product model, etc. The pad 30 is used to ground directly or indirectly. The pad 30 is located, for example, around the memory circuit 20 or above the memory circuit 20. In this embodiment, the pad 30 is set above the memory circuit and outside the memory circuit 20. The electrostatic conductor 40 is connected to the pad 30. The electrostatic conductor 40 is used to conduct the static electricity to the ground. The ground, for example, can be a system ground or a device ground of an electronic device 400 (see FIG. 7) to which the biometric sensing module 100 is applied. The ground is usually loaded with a voltage of 0 volt (V). The pad 30, for example, can be grounded via a modulation circuit or a power supply when the pad 30 is indirectly grounded.

In this embodiment, the electrostatic conductor 40 extends from the pad 30 to a place above the memory circuit 20. In other embodiments, the electrostatic conductor 40 also can extend perpendicularly upwards from the pad 30 or extend in other appropriate ways.

The electrostatic conductor 40 can be a wire. The wire is a metal wire. The material of the metal wire, for example, can be gold, copper, aluminum, etc. It is understood that the wire also can be made of other appropriate conductive materials. The wire has the advantages of simple structure, less material consumption, and low material cost. In addition, the electrostatic conductor 40 also can be other conductive elements with appropriate shape, and is not limited to the wire.

Furthermore, the wire includes a protrusion 41 set above the memory circuit 20. The protrusion 41 is formed by the wire bonding process. The protrusion 41 is shaped as a tip or an arc to conduct the static electricity of the user to ground via the pad 30, thus the memory circuit 20 can be prevented from the damage made by the static electricity.

The number of the pad 30 may be one or more than one. The material of the pad 30 can be one or a combination of aluminum, copper, gold, silver, platinum, palladium, nickel, etc. It is understood that the material of the pad 30 also can be other appropriate materials.

In this embodiment, the memory circuit 20 is the ultraviolet erasable memory, such as OTP memory or MTP memory. It is understood that the memory circuit 20 also can be other appropriate types of memory and not limited to the ultraviolet erasable memory.

The biometric sensing module 100 may further includes a first insulating layer 50. The first insulating layer 50 is set above the sensing unit 10 and the memory circuit 20. The pad 30 is set on the first insulating layer 50. In other embodiments, the first insulating layer 50 is set on one of the memory circuit 20 and the sensing unit 10. Alternatively, the first insulating layer 50 is omitted, and the pad 30 is set around the memory circuit 20.

Figure 2:
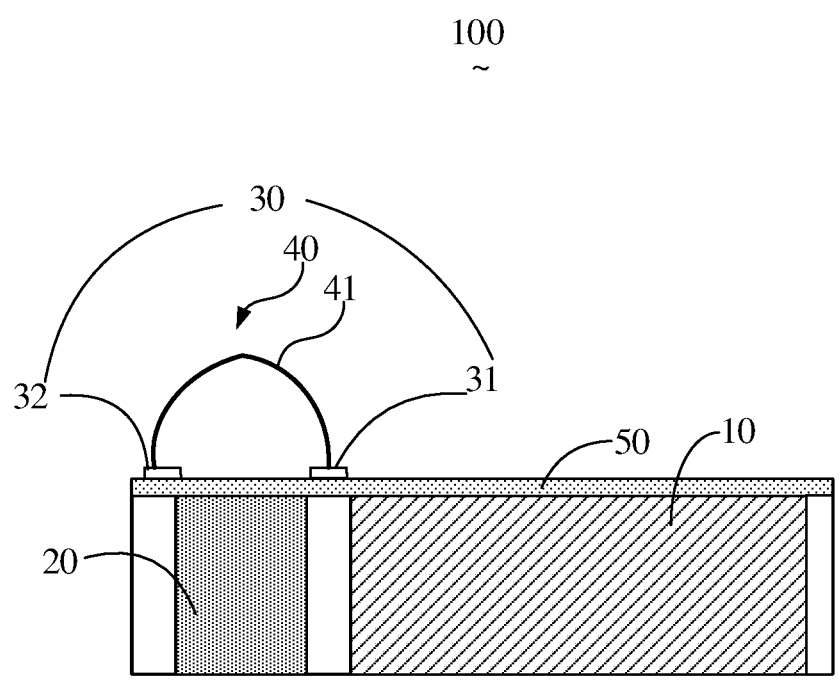
FIG. 2 is a cross sectional view of a second embodiment of a biometric sensing module of the present disclosure.
Figure 2A:
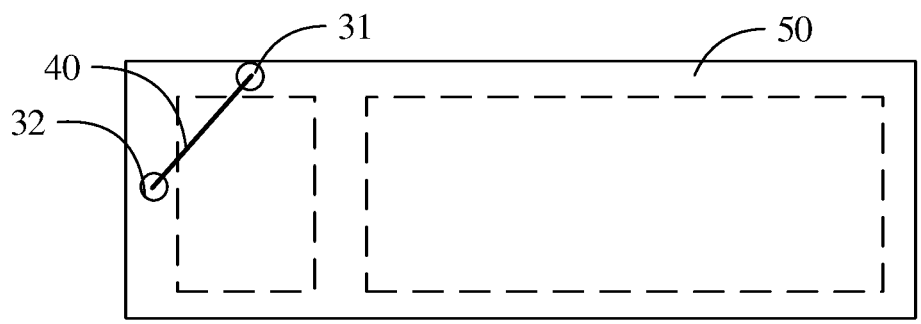
FIG. 2a is a top view of the second embodiment of the biometric sensing module of the present disclosure, showing a first arrangement of a number of pads of the biometric sensing module.
Figure 2B:
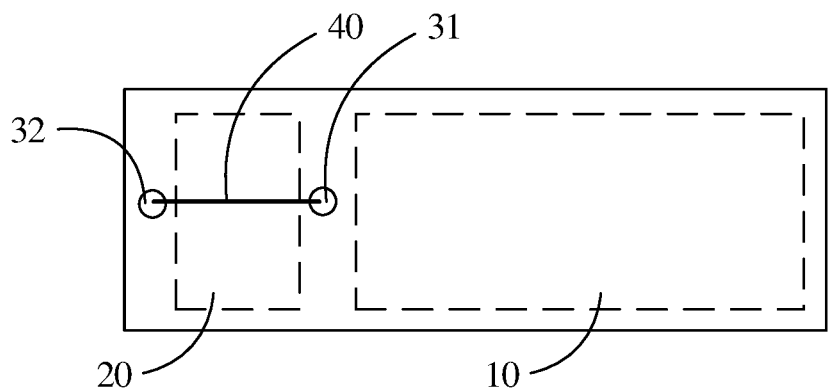
FIG. 2b is a top view of the second embodiment of the biometric sensing module of the present disclosure, showing a second arrangement of a number of pads of the biometric sensing module.
Figure 2C:
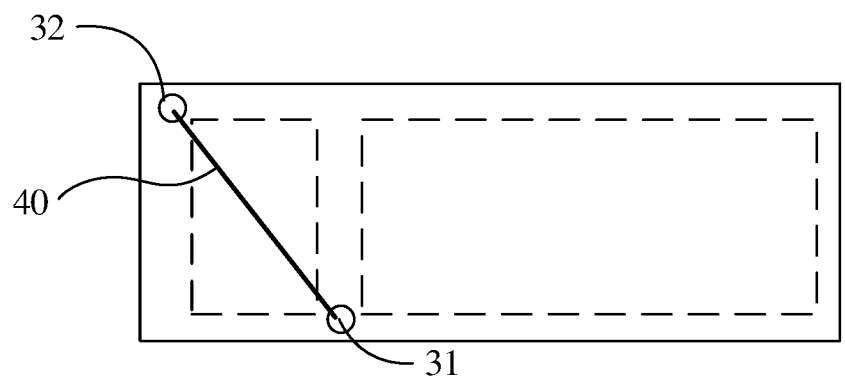
FIG. 2c is a top view of the second embodiment of the biometric sensing module of the present disclosure, showing a third arrangement of a number of pads of the biometric sensing module.
Figure 2D:
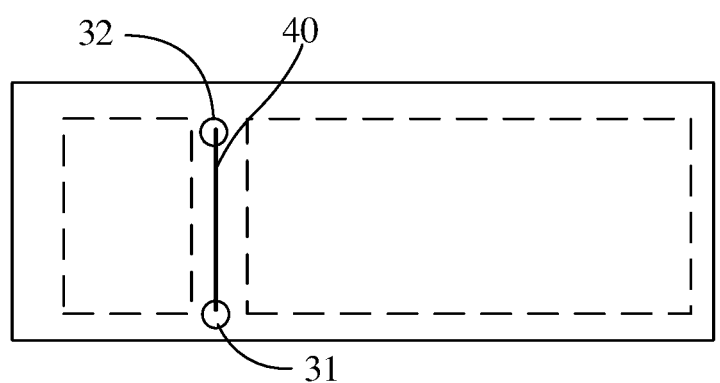
FIG. 2d is a top view of the second embodiment of the biometric sensing module of the present disclosure, showing a third arrangement of a number of pads of the biometric sensing module.

Referring to FIGS. 2-2d, FIG. 2 is a cross sectional view of a second embodiment of the biometric sensing module 100 of the present disclosure. FIG. 2a is a top view of the second embodiment of the biometric sensing module 100 of the present disclosure, showing a first arrangement of a number of pads 30 of the biometric sensing module 100. FIG. 2b is a top view of the second embodiment of the biometric sensing module 100 of the present disclosure, showing a second arrangement of a number of pads 30 of the biometric sensing module 100. FIG. 2c is a top view of the second embodiment of the biometric sensing module 100 of the present disclosure, showing a third arrangement of a number of pads 30 of the biometric sensing module 100. FIG. 2d is a top view of the second embodiment of the biometric sensing module 100 of the present disclosure, showing a fourth arrangement of a number of pads 30 of the biometric sensing module 100.

Referring to FIG. 2, the pad 30 includes a first sub-pad 31 and a second sub-pad 32 formed around the memory circuit 20. The first sub-pad 31 and the second sub-pad 32 are used to receive a ground signal. Two ends of the electrostatic conductor 40 are correspondingly connected to the first sub-pad 31 and the second sub-pad 32.

One or both of the first sub-pad 31 and the second sub-pad 32 can be directly grounded, electrically connected to the ground end of the memory circuit 20 or the sensing unit 10, or electrically connected to the ground of system. It is understood that the grounding way of the first sub-pad 31 and the second sub-pad 32 of the present disclosure are not limited to the ways listed herein and can be other appropriate grounding ways.

The first sub-pad 31 and the second sub-pad 32 are correspondingly formed at arbitrary two sides of the memory circuit 20 so that the electrostatic conductor 40 crosses over the memory circuit 20. For example, the first sub-pad 31 and the second sub-pad 32 are correspondingly formed at two adjacent sides, two opposite sides of the memory circuit 20, etc. Referring to FIG. 2a, the first sub-pad 31 and the second sub-pad 32 are correspondingly formed at two adjacent sides of the memory circuit 20. Thus, the electrostatic conductor 40 connecting the first sub-pad 31 and the second sub-pad 32 crosses over the memory circuit 20 at a corner composed of the two adjacent sides where the first sub-pad 31 and the second sub-pad 32 formed. Referring to FIG. 2b, the first sub-pad 31 and the second sub-pad 32 are correspondingly formed at two opposite sides of the memory circuit 20. Thus, the electrostatic conductor 40 connecting the first sub-pad 31 and the second sub-pad 32 horizontally crosses over the memory circuit 20.

Referring to FIG. 2c, alternatively, the first sub-pad 31 and the second sub-pad 32 are correspondingly formed at the opposite corners of the memory circuit 20. Thus, the electrostatic conductor 40 connecting the first sub-pad 31 and the second sub-pad 32 crosses over the memory circuit 20 along the diagonal line of the memory circuit 20.

Referring to FIG. 2d, alternatively, the first sub-pad 31 and the second sub-pad 32 are correspondingly formed at the same side of the memory circuit 20 with a predetermined interval. Thus, the electrostatic conductor 40 connecting the first sub-pad 31 and the second sub-pad 32 do not cross over the memory circuit 20 but still higher than the memory circuit 20.

Alternatively, in other embodiments, the first sub-pad 31 can be set at a corner of the memory circuit 20, and the second sub-pad 32 is set on one side of the memory circuit 20. In the FIG. 2, FIG. 2b, and FIG. 2c, the first sub-pad 31 is set between the memory circuit 20 and the sensing unit 10. Alternatively, in other embodiments, the first sub-pad 31 also can be set right above the memory circuit 20 or the sensing unit 10.

The arrangements of the first sub-pad 31 and the second sub-pad 32 are not limited to the arrangements described in the present disclosure, and can be other appropriate arrangements. For example, the first sub-pad 31 and the second sub-pad 32 can be correspondingly set at two sides of each two or three circuits. Thus, one electrostatic conductor 40 connecting the first sub-pad 31 and the second sub-pad 32 is set corresponding to each of the two or three circuits.

It is noted that the biometric sensing module 100, the memory circuit 20, and the sensing unit 10 are not limited to the rectangle shown in FIGS. 2a-2d and also can be other regular shapes, such as a square, a hexagon, an octagonal, etc., irregular shapes, or other appropriate shapes. In addition, the first sub-pad 31 and the second sub-pad 32 are not limited to the circular shape shown in FIGS. 2a-2d and also can be other regular shapes, such as a square, a rectangular, etc., irregular shapes, or other appropriate shapes.

Figure 3:
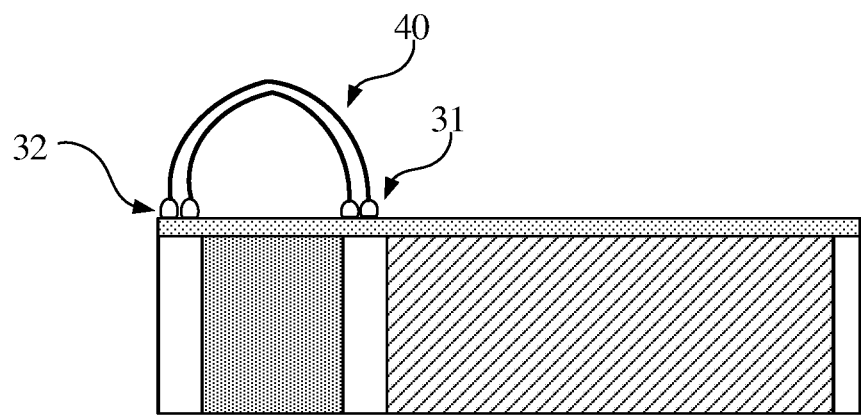
FIG. 3 is a cross sectional view of a third embodiment of a biometric sensing module of the present disclosure.
Figure 3A:
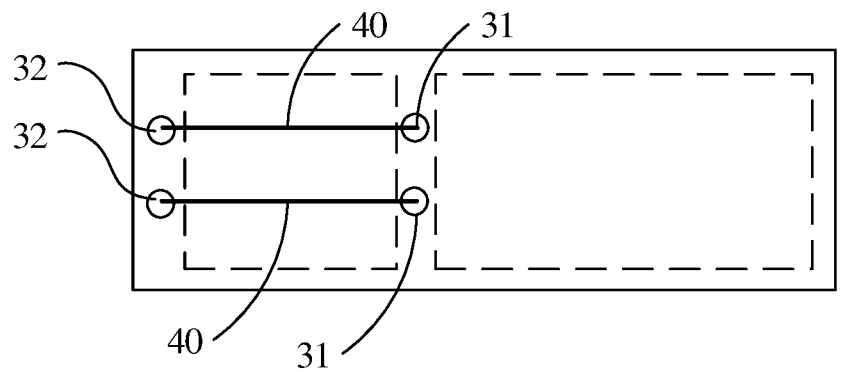
FIG. 3a is a top view of the third embodiment of the biometric sensing module of the present disclosure, showing a first arrangement of a number of electrostatic conductors of the biometric sensing module.
Figure 3B:
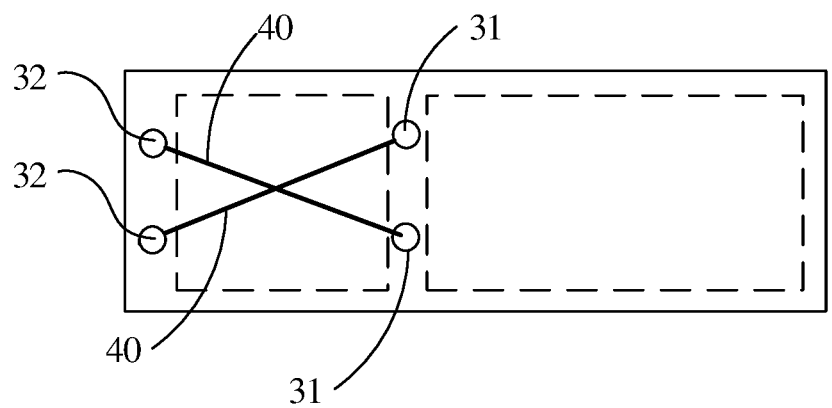
FIG. 3b is a top view of the third embodiment of the biometric sensing module of the present disclosure, showing a second arrangement of a number of electrostatic conductors of the biometric sensing module.

Referring to FIGS. 3-3b, FIG. 3 is a cross sectional view of a third embodiment of the biometric sensing module 100 of the present disclosure. FIG. 3a is a top view of the third embodiment of the biometric sensing module 100 of the present disclosure, showing a first arrangement of a number of electrostatic conductors 40 of the biometric sensing module 100. FIG. 3b is a top view of the third embodiment of the biometric sensing module 100 of the present disclosure, showing a second arrangement of a number of electrostatic conductors 40 of the biometric sensing module 100.

The number of the electrostatic conductor 40 can be one or more than one. The electrostatic conductors 40 are spaced apart when the electrostatic conductors 40 are more than one. The electrostatic conductors 40 can be spaced apart on the vertical plane or on the horizontal plane. For example, the electrostatic conductors 40 of FIG. 3 are spaced apart on the vertical plane, and the electrostatic conductors 40 of FIG. 3a are spaced apart on the horizontal plane. It is noted that relative heights between the memory circuit 20 and each of the electrostatic conductors 40 in FIG. 3 are different from each other, but the shape and size of each electrostatic conductor 40 in FIG. 3 can be the same as one another or different from each other. It is noted that horizontal projection lengths of each electrostatic conductors 40 in FIG. 3a are the same as one another, but the physical lengths, shapes, sizes of each electrostatic conductor 40 can be the same as one another or different from each other.

The electrostatic conductors 40 can be arranged in an array, such as a matrix. It is understood that the electrostatic conductors 40 also can be arranged in other regular or irregular ways. Alternatively, as shown in FIG. 3b, the electrostatic conductors 40 also can cross each other.

It is noted that there are only two electrostatic conductors 40 schematically shown in FIG. 3 to FIG. 3b, the number of the electrostatic conductors 40 is not limited to two, and can be more than two, correspondingly, the numbers of the first sub-pads 31 and the second sub-pad 32 increase. In addition, the arrangement of the electrostatic conductors 40 is not limited to the embodiments described herein, and can employ other arrangements.

Figure 4:
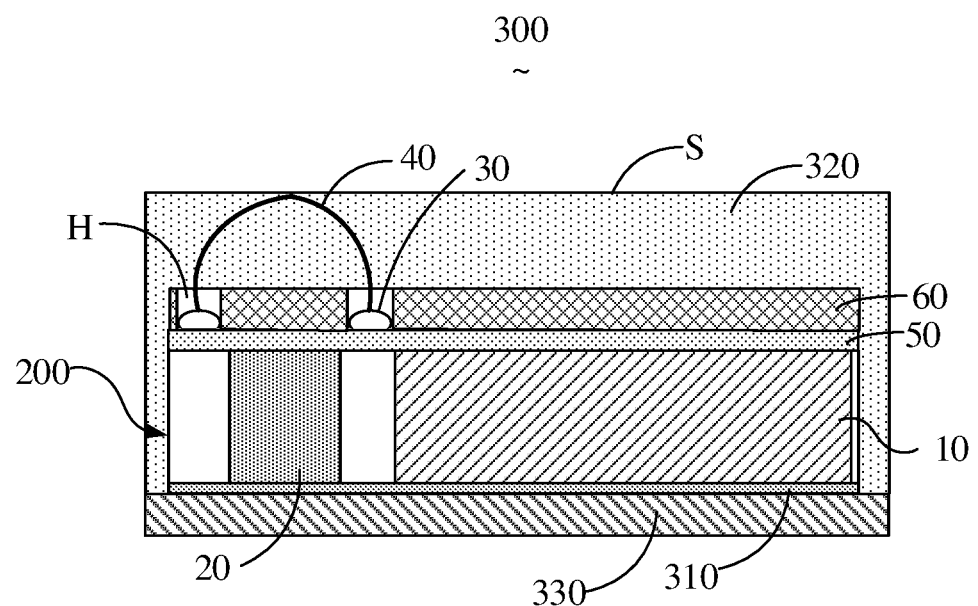
FIG. 4 is a cross sectional view of a first embodiment of a biometric sensing chip of the present disclosure.

Referring to FIGS. 2 and 4, FIG. 4 is a cross sectional view of a first embodiment of the biometric sensing chip 300. The biometric sensing chip 300 includes the biometric sensing module 100.

The biometric sensing chip 300 includes the biometric sensing die 200 and the electrostatic conductor 40. The biometric sensing die 200 is set on the circuit board 330.

The biometric sensing die 200 includes the memory circuit 20. Preferably, the electrostatic conductor 40 is partially or entirely set above the memory circuit 20 to conduct the static electricity to the ground.

The biometric sensing die 200 further includes a substrate 310, the sensing unit 10, the first insulating layer 50, a second insulating layer 60, and the pad 30. The memory circuit 20 is set on the substrate 310. The first insulating layer 50 and the second insulating layer 60 are set on the memory circuit 20. The memory circuit 20 is located between the substrate 310 and the first insulating layer 50. The pad 30 is set on the first insulating layer 50. The second insulating layer 60 is formed on the first insulating layer 50 and defines a through hole H corresponding to the pad 30. In this embodiment, there are two pads 30 on the first insulating layer 50, correspondingly, there are two through holes 61 in the second insulating layer 60. The electrostatic conductor 40 is connected to the pads 30 via the through holes H. The substrate 310 is made of, for example, semiconductor. The semiconductor, for example, can be silicon. It is understood that the substrate 310 also can be made of other appropriate materials, such as an insulating material.

For example, the second insulating layer 60 covers the memory circuit 20 or both the memory circuit 20 and the sensing unit 10 to prevent the biometric sensing die 200 from a mechanical or chemical damage when the biometric sensing die 200 is encapsulated to be the biometric sensing chip 300.

The biometric sensing chip 300 of the present disclosure may include a single biometric sensing die 200 or a number of biometric sensing dies 200. For example, the memory circuit 20 is formed in the biometric sensing die 200 when the biometric sensing chip 300 includes the single biometric sensing die 200. The memory circuit 20 can be formed as an independent memory die and set outside the biometric sensing die 200 when the biometric sensing chip 300 includes a number of biometric sensing dies 200. Correspondingly, the first insulating layer 50 and the second insulating layer 60 are not formed on the memory die 30. One of the pads 30 is formed on the biometric sensing die 200, the other one of the pads 30 is formed on the circuit board 330 (see below) and located at left side of the memory die 20. The electrostatic conductor 40 crosses over the memory die 30. Alternatively, both pads 30 located at two sides of the memory die 30 are formed on the circuit board 330.

The number of the biometric sensing die 200 of the biometric sensing chip 300 and formation thereof are not limited to the number and the formation described above, and can be other appropriate numbers and formations. For example, the memory circuit 20 can be formed in a control die (not shown) when the biometric sensing chip 300 includes two biometric sensing dies 200. The control die is used to control the biometric sensing dies 200 to sense the biological information.

It is understood that the biometric sensing module 100 of the biometric sensing chip 300 is not limited to the embodiment of biometric sensing module 100 shown in FIG. 2, and can be can be replaced by any one of embodiments of the biometric sensing module 100 described above.

Referring to FIG. 4, the biometric sensing chip 300 further includes a circuit board 330 and the encapsulant 320. The encapsulant 320 encapsulates the biometric sensing die 200 and the electrostatic conductor 40 into the biometric sensing chip 300. The encapsulant 320 is filled into a space between the electrostatic conductor 40 and the biometric sensing die 200 to fix the electrostatic conductor 40 in the encapsulant 320.

The material of the encapsulant 320 can be, for example, an epoxy resin material or other insulating materials. The circuit board 330 is, for example, a printed circuit board.

An encapsulating method of the biometric sensing chip 300, for example, includes step 101 to step 104. Step 101, the biometric sensing die 200 is electrically connected to the circuit board 330. Step 102, the electrostatic conductor 40 is connected to the pads 30 via the wire bonding process. Step 103, the circuit board 320 loading the biometric sensing chip 300 is disposed in a mold of the epoxy resin material. Step 104, the mold is closed to encapsulate the biometric sensing chip 300 therein. However, the steps of the encapsulating method of the biometric sensing chip 300 of the present disclosure are not limited to the steps described herein, and can include other appropriate steps.

A side surface S of the encapsulant 320 opposite to the memory circuit 20 is used to contact with the object or receive the other input operation and is defined as a sensing surface. The electrostatic conductor 40 is closer to the sensing surface 322 than the memory circuit 20. Since the electrostatic conductor 40 is located between the memory circuit 20 and the encapsulant 320, the static electricity is conducted to the ground through the electrostatic conductor 40 when the object introduces the static electricity. Thus, the memory circuit 20 is prevented from the damage of the static electricity.

In addition, the biometric sensing chip 300 includes the circuit board 330 when the biometric sensing chip 300 employs the ball grid array (BGA) encapsulation. The circuit board 300 can be omitted and the biometric sensing chip 300 includes a frame lead set around the biometric sensing chip 200 when the biometric sensing chip 300 employs quad flat no-lead encapsulation.

Figure 5:
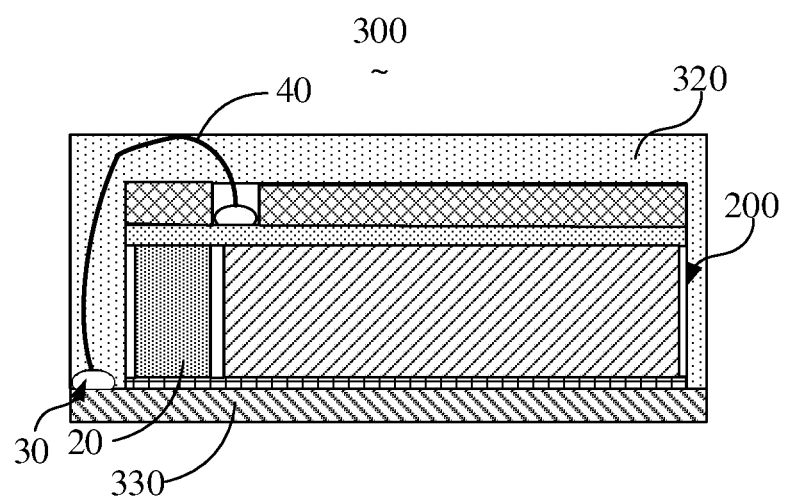
FIG. 5 is a cross sectional view of a second embodiment of a biometric sensing chip of the present disclosure.

Referring to FIG. 5, FIG. 5 is a cross sectional view of a second embodiment of the biometric sensing chip 300 of the present disclosure. One end of the electrostatic conductor 40 is set on the biometric sensing die 200. The other end of the electrostatic conductor 400 is set on the circuit board 330. The electrostatic conductor 40 crosses over the memory circuit 20.

Correspondingly, when the number of the pads 30 is more than one, a part of the pads 30 are set on the biometric sensing dies 200. The other part of the pads 30 are set on the circuit board 330. The electrostatic conductor 40 is connected to the pads 30.

The pads 300 can be replaced by the lead frame when the biometric sensing chip 300 employs the QFN encapsulation.

Figure 6:
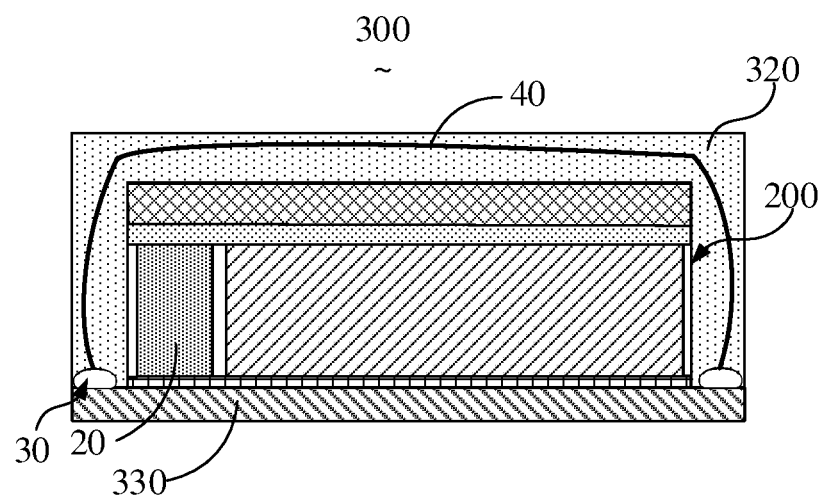
FIG. 6 is a cross sectional view of a third embodiment of a biometric sensing chip of the present disclosure.

Referring to FIG. 6, FIG. 6 is a cross sectional view of a third embodiment of the biometric sensing chip 300. Alternatively, both ends of the electrostatic conductor 40 are set on two sides of the biometric sensing die 200. Preferably, both ends of the electrostatic conductor 40 are correspondingly set on two opposite sides of the biometric sensing die 200. Correspondingly, the electrostatic conductor 40 crosses over the biometric sensing die 200. A part of the electrostatic conductor 40 is located right above the memory circuit 20.

In this embodiment, the pads 30 connecting with the electrostatic conductor 40 are set on the circuit board 330. The pads 30 are directly or indirectly connected to the ground.

The pads 300 can be replaced by the lead frame when the biometric sensing chip 300 employs the QFN encapsulation.

The technical idea of the present disclosure is not limited to the biometric sensing module 100 and the biometric sensing chip 300 described above and can be applied to other appropriate chips including the memory circuit 20, in particular, the memory circuit 20 is an ultraviolet erasable memory and needs to be contacted or approached by the user when the chips is in operation. The electrostatic conductor 40 is set right above or across the memory circuit 20 by the wire bonding when the chip is encapsulated, thus the static flowing to the memory circuit 20 is conducted away when the user contacts on the chip.

The chip can be, for example, a capacitive sensor chip, an optical sensor chip, and an ultrasonic sensor chip.

Figure 7:
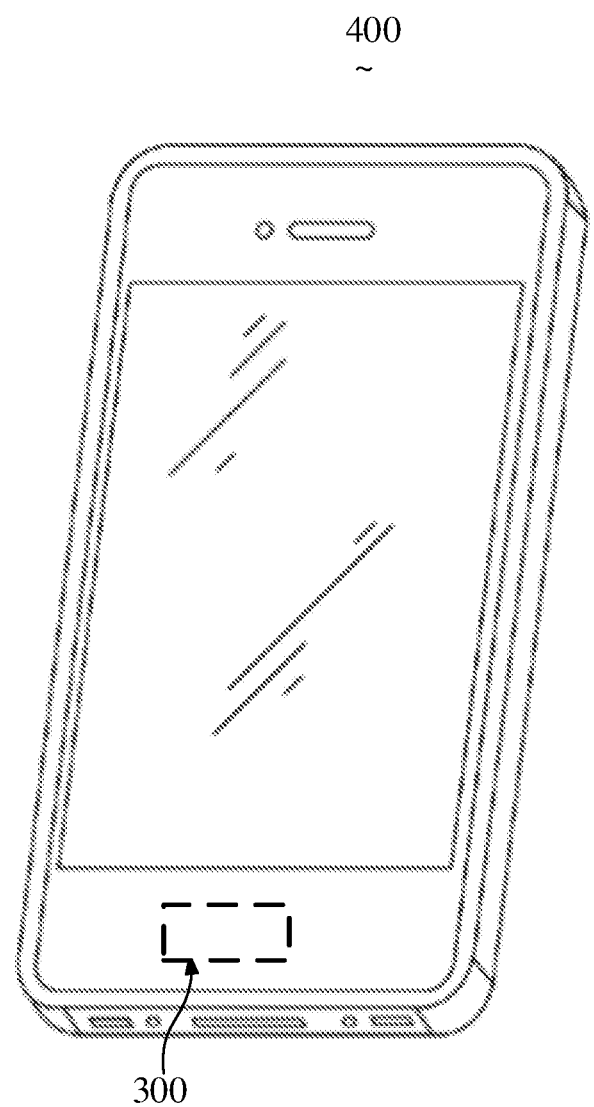
FIG. 7 is a three-dimensional view of an electronic device of the present disclosure.

Referring to FIG. 7, FIG. 7 is a three-dimensional view of an electronic device 400 of the present disclosure. The electronic device 400 includes any one of the embodiments of the biometric sensing chip 300 described above. In this embodiment, the electronic device 400 is a cellular phone.

It is noted that the electronic device 400 may be, but not limited to, a portable electronic device, a household electronic device, or an on-board electronic device. The portable device can be a mobile terminal, such as a cellular phone, a tablet computer, a notebook computer, a wearable product, etc. The household electronic device can be, for example, a smart lock, a television, a refrigerator, a desktop computer, etc. The on-board electronic device can be, for example, a car display, a driving recorder, a navigator, a car refrigerator, etc.

Although the present disclosure has been described with reference to various embodiments, it is understood that these embodiments are illustrative and the scope of the present disclosure is not limited thereto. Many variations, modifications, additions, and improvements are possible. More generally, various embodiments disclosed in accordance with the present disclosure are described in the context of the specific embodiment. The functions of the disclosed embodiments of the present disclosure may be separated or combined in various ways, or described in different terms. These and other variations, modifications, additions, and improvements should be considered within the scope of the present disclosure defined by the following claims.

What is claimed is:

1. A biometric sensing chip comprising:
    a biometric sensing die comprising a memory circuit for saving data;
    two pads set on the biometric sensing die and grounded directly or indirectly;
    a first insulating layer set on the memory circuit, wherein the pads are set on the first insulating layer; and
    an electrostatic conductor partially or entirely set right above the memory circuit for discharging static electricity, wherein the electrostatic conductor is directly or indirectly grounded, and two ends of the electrostatic conductor are correspondingly connected to the two pads.

2. The biometric sensing chip of claim 1, wherein the electrostatic conductor crosses over the memory circuit.

3. The biometric sensing chip of claim 1, wherein the memory circuit is an ultraviolet erasable memory circuit.

4. The biometric sensing chip of claim 1, wherein the memory circuit comprises a one-time programmable memory and/or a multi-time programmable memory.

5. The biometric sensing chip of claim 1, wherein the electrostatic conductor is a wire.

6. The biometric sensing chip of claim 5, wherein the electrostatic conductor is formed as a protrusion or a tip right above the memory circuit.

7. The biometric sensing chip of claim 5, wherein ways of setting the wire comprise that both ends of the wire are set on the biometric sensing die, one end of the wire is set on the biometric sensing die and the other end of the wire is set at a side of biometric sensing die, or both ends of the wire are correspondingly set at two opposite sides of the biometric sensing die.

8. The biometric sensing chip of claim 1, further comprising an encapsulant for encapsulating the biometric sensing die and the electrostatic conductor, wherein the electrostatic conductor is located between the biometric sensing die and the encapsulant.

9. The biometric sensing chip of claim 8, wherein the encapsulant is filled in a space between the electrostatic conductor and the encapsulant.

10. The biometric sensing chip of claim 1, wherein ways of setting the pads comprise that both pads are set on the biometric sensing die, one of the two pads is set on the biometric sensing die and the other one of the two pads is set at one side of the biometric sensing die, or both pads are correspondingly set at two opposite sides of the biometric sensing die.

11. The biometric sensing chip of claim 1, further comprising a second insulating layer formed on the first insulating layer, wherein the second insulating layer defines a through hole corresponding to each pad when both pads are set on the biometric sensing die, and the electrostatic conductor is connected to the pad via the through hole.

12. The biometric sensing chip of claim 1, defining a side surface for sensing biological information of a user, wherein the electrostatic conductor is closer to the sensing surface than the memory circuit.

13. The biometric sensing chip of claim 1, further comprising a sensing unit for sensing biological information of a user.

14. The biometric sensing chip of claim 1, wherein the biometric sensing chip comprises one or more than one of a fingerprint sensor chip, a blood oxygen sensor chip, and a heartbeat sensor chip.

15. An electronic device comprising the biometric sensing chip of claim 1.

16. A biometric sensing chip comprising:
a biometric sensing die comprising an ultraviolet erasable memory;
two pads set on the biometric sensing die and grounded directly or indirectly;
a first insulating layer set on the memory circuit, wherein the pads are set on the first insulating layer; and
a wire partially or entirely set right above the ultraviolet erasable memory;
wherein the wire is formed as a protrusion or a tip right above the biometric sensing die and is grounded directly or indirectly, and two ends of the electrostatic conductor are correspondingly connected the two pads.

17. The biometric sensing chip of claim 16, further comprising an encapsulant for encapsulating the biometric sensing die and the electrostatic conductor, wherein the electrostatic conductor is located between the biometric sensing die and the encapsulant.

18. The biometric sensing chip of claim 16, further comprising a second insulating layer formed on the first insulating layer, wherein the second insulating layer defines a through hole corresponding to each pad when both pads are set on the biometric sensing die, and the electrostatic conductor is connected to the pad via the through hole.

\* \* \* \* \*